United States Patent [19]

Yamauchi

[11] Patent Number: 5,515,049
[45] Date of Patent: May 7, 1996

[54] NOISE-REDUCING CIRCUIT

[75] Inventor: Satoru Yamauchi, Tsuchiura, Japan

[73] Assignee: Texas Instruments Incorporated, Dallas, Tex.

[21] Appl. No.: 218,275

[22] Filed: Mar. 25, 1994

[30] Foreign Application Priority Data

Mar. 26, 1993 [JP] Japan ................... 5-092149

[51] Int. Cl.$^6$ .................................. H03M 1/12
[52] U.S. Cl. ...................................... 341/155
[58] Field of Search .................. 341/155, 122; 348/611, 614

[56] References Cited

U.S. PATENT DOCUMENTS 5,089,917 2/1992 Kanota et al. ................ 360/45
5,353,069 10/1994 Kobo et al. .................. 348/611

*Primary Examiner*—Brian K. Young
*Attorney, Agent, or Firm*—David S. Guttman; Richard L. Donaldson

[57] ABSTRACT

A noise-reducing circuit for performing effective noise reduction without an accompanying trailing phenomenon or other adverse effects with respect to the edge of a moving image portion. Digital sample values as output from an A/D converter are input to a waveform equalizer, which performs prescribed waveform equalizing processing with a MUSE format resample condition being met. In a noise reducing unit, for the various resample values from waveform equalizer, the correlation value in the impulse response waveforms corresponding to the resample values is derived from the sample values around the resample value and the other resample values, and the sum of the resample value and the correlation value is calculated. In this way, a resample value with an increased signal/noise ratio can be obtained at the output terminal of the noise reducing unit.

8 Claims, 6 Drawing Sheets

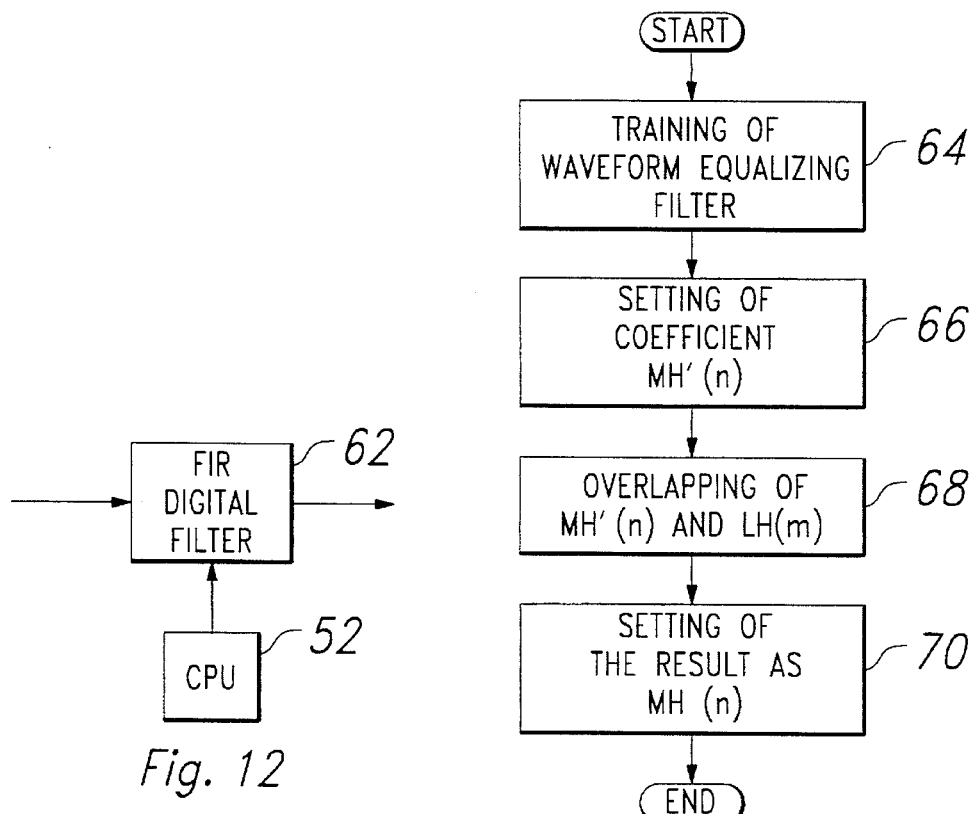
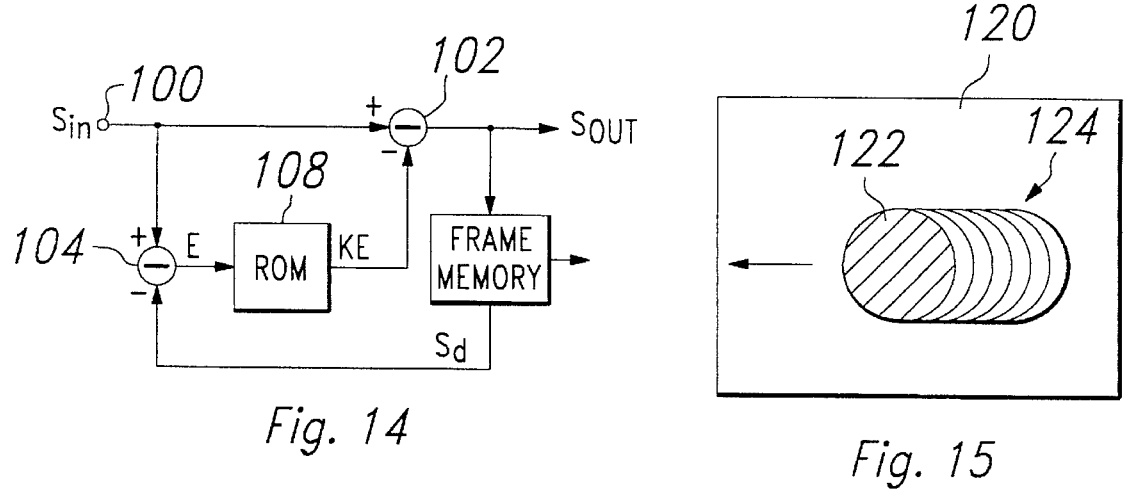

NOISE-REDUCING CIRCUIT

BACKGROUND OF THE INVENTION

For high-vision [transliteration] broadcasting using the MUSE format, the band-compressed image signal is transmitted as the sample value analog signal at a transmission rate of 16.2 MHz. On the receiver side, the received sample value analog signal is resampled at 16.2 MHz and the MUSE format is regenerated.

FIG. 14 is a diagram illustrating the configuration of a conventional noise-reducing circuit used for the MUSE data. At input terminal 100, the resample value obtained by means of sampling the demodulated sample values at 16.2 MHz using an A/D converter (not shown in the figure), that is, the digital resample value of 16.2 MHz corresponding to the analog sample value is input as the input image signal Sin. This input image signal Sin is sent to one input terminal of subtractor 102, and it is also sent to one input terminal of subtractor 104. The image signal two frames before (one picture before in the MUSE format) is applied to other input terminal of subtractor 104 as delay image signal Sd from frame memory 106. At subtractor 104, delay image signal Sd is subtracted from input image signal Sin to obtain the difference. The difference value E output from subtractor 104 is input to coefficient multiplier 108 consisting of ROM (lookup table), where it is multiplied with a constant K. The corrected difference value KE output from coefficient multiplier 108 is input to the other input terminal of subtractor 102. At subtractor 102, corrected difference value KE is subtracted from input image signal Sin. The output signal of subtractor 102 is output as output image signal Sout, and it is also input to frame memory 106.

In this noise-reducing circuit, the following formula is established in subtractor 102:

$$Sout = Sin - KE \tag{1}$$

In subtractor 104, the following formula is established:

$$E = Sin - Z^{-1} \cdot Sout \tag{2}$$

where, $Z^{-1}$ represents the delay time of frame memory 106. It is $\frac{1}{15}$ sec in the case of the MUSE format.

From formulas (1) and (2), the following formula of the input/output characteristics or transmission function between input image signal Sin and output image signal Sout is obtained:

$$Sout/Sin = (1-K)/(1-KZ^{-1}) \tag{3}$$

On the other hand, as the noise is without correlation, the following input/output characteristics or transmission function is established between noise Nin contained in input image signal Sin and noise Nout contained in output image signal Sout.

$$Nout/Nin = \{(1-K)/(1-K^2)\}^{1/2} \tag{4}$$

Consequently, by means of this noise-reducing circuit, the ratio of the image signal to noise (S/N ratio) can be increased by a factor of $(1+K/1-K)^{1/2}$, that is, the noise level can be reduced.

However, when a moving image portion is contained in the image, there is a significant change in the present pixel with respect to that one image before in the vicinity of the edge of the moving image portion. Consequently, the difference value E between input image signal Sin and delay image signal Sout is large. In the noise-reducing circuit, appropriate control is performed to ensure that if difference value E exceeds a prescribed limit, the limiter function of coefficient multiplier 108 takes place, multiplication coefficient K becomes null, and virtually no corrected difference value KE is sent to subtractor 102, and input image signal Sin is output directly as output image signal Sout. That is, for the edge of the moving image portion with a large change 30 that the difference value E is larger than a prescribed upper limit value, no noise reduction is performed.

On the other hand, when the difference between the background and the moving image portion is small, the change in the color in the vicinity of the edge of the moving image portion is relatively small, and a relatively small difference value E can be obtained from subtractor 104. However, in the conventional noise reducing circuit, if difference value E is smaller than the upper limit, for both the static picture and the moving image, constant K is multiplied by the difference value at coefficient multiplier 108, and corrected difference value KE is sent to subtractor 102. As a result, in the vicinity of the moving image portion in the regenerated image, the image is overlapped at the corresponding position on the preceding image, causing blurring in time. For example, as shown in FIG. 15, when the ball 122 in image 120 moves in the direction indicated by the arrow, a trailing phenomenon 124 takes place, with a residual image dragging its tail in the reverse direction to the moving direction (backward direction). This is a problem.

In this way, in the conventional noise reducing circuit, the noise is reduced by exploiting the correlation property among the frames. Consequently, it is impossible to perform noise reducing processing for the edge of the moving image portion with a large change, and adverse effects, such as the trailing phenomenon, etc., are caused for the edge of the moving image portion with a small change.

It is an object of this invention to provide a noise reducing circuit which performs the noise reduction effectively free of the trailing phenomenon and other adverse effects for the edge of a moving image portion.

SUMMARY OF THE INVENTION

A noise reducing circuit in accordance with the invention comprises an A/D converter which samples the sample value analog signal at a frequency twice or higher than that of the transmission rate, a waveform equalizing means which performs waveform equalizing processing for the various sample values corresponding to the analog sample values of the sample value analog signal among the sample values output from the A/D converter, and a noise reducing unit which, for the various resample values output from the waveform equalizing means, derives the prescribed correlation value in the impulse response waveform corresponding to the various resample values based on the resample values around the various resample values and some other prescribed number of resample values, and which calculates the sum of the various resample values and the correlation values.

When waveform equalizing processing is performed for the resample value corresponding to the analog sample value (original sample value) of the sample value analog signal, the impulse response waveform corresponding to each sample value becomes the prescribed waveform. In this case, each sample value after the waveform equalizing operation can be taken as the value of synthesis of the correlation values in the impulse response waveforms corresponding to the series of resample values around it.

According to this invention, for each resample value, at the sample points immediately before and/or after it, the correlation value of various resample values can be derived by subtracting from the sample values at the sample points the correlation values in the impulse response waveforms corresponding to the other prescribed number of resample values around the various resample values. When this correlation value is added to the various resample values, the addition values with the prescribed ratio or amplification rate at the various resample values can be obtained. On the other hand, for the noise, as it has no correlation, addition is made at a ratio or amplification rate smaller than the sum of the resample value and its correlation value. As a result, the S/N ratio can be increased and the noise can be reduced.

BRIEF DESCRIPTION OF THE DRAWINGS

FIG. 12 is a block diagram illustrating a specific configuration of one of the FIR digital filters that form the waveform equalizer and noise reducing unit shown in FIG. 10.

FIG. 13 is a flow chart illustrating a processing procedure carried out by a CPU for determining the filter coefficients MH(n) of the FIR digital filter shown in FIG. 12.

FIG. 14 is a block diagram illustrating the configuration of a conventional noise reducing circuit.

FIG. 15 is a diagram illustrating the trailing phenomenon of a moving image when a conventional noise reducing circuit such as shown in FIG. 14 is employed for noise reduction.

In reference numerals as shown in the drawings:

Figure 1:
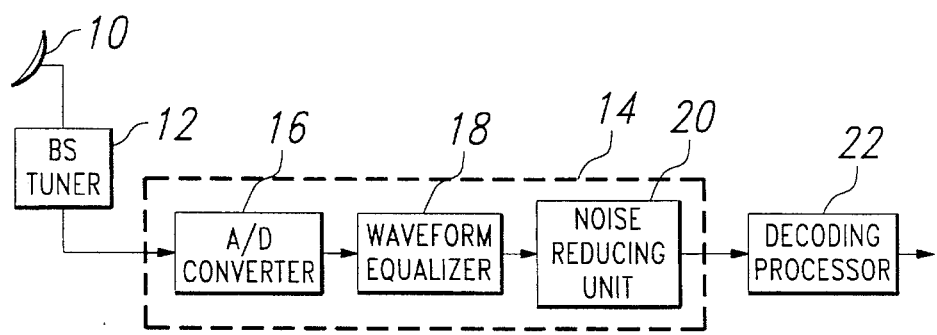
FIG. 1 is a block diagram illustrating a configuration of a MUSE format high-vision receiver system using an embodiment of a noise reducing circuit in accordance with the invention.

14, noise reducing circuit
16, A/D converter
18, waveform equalizer
20, noise reducing unit
30, delay circuit
32, digital filter
34, FIR digital filter
36, subtractor
38, divider
52, CPU
54, FIR digital filter
62, FIR digital filter

DESCRIPTION OF PREFERRED EMBODIMENTS

FIG. 1 is a diagram illustrating a configuration of a high-vision receiver system with the MUSE format using an embodiment of a noise reducing circuit in accordance with the invention. In this figure, portion 14 indicated by the broken line is the noise reducing circuit in this embodiment. The noise reducing circuit comprises an A/D converter 16, waveform equalizer 18, and noise reducing unit 20. After reception by BS antenna 10, the MUSE format sample value analog signal demodulated by BS tuner 12 is input to A/D converter 16, where the signal is converted to a digital signal at a sampling frequency of 32.4 MHz, twice the transmission rate (16.2 MHz) of the sample value analog transmission.

Figure 2:
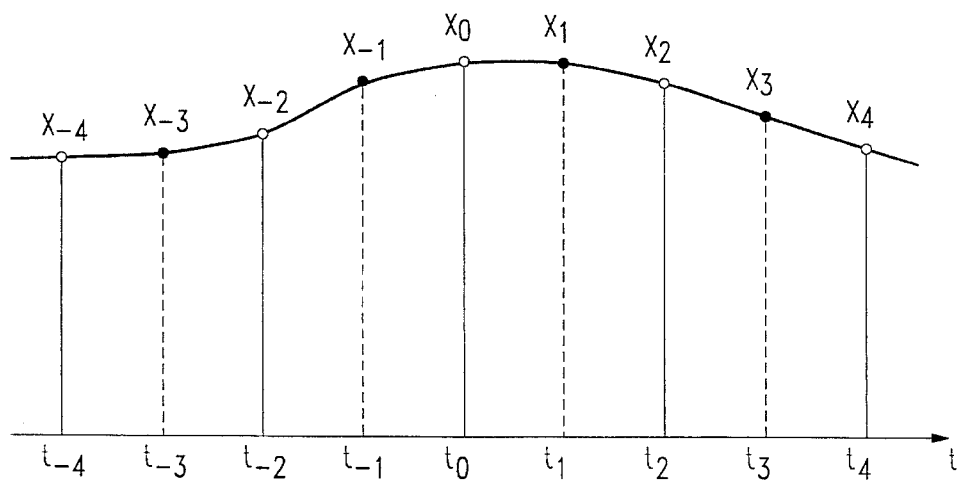
FIG. 2 is a schematic diagram illustrating a digital sample value with a period corresponding to 32.4 MHz as output from the A/D converter of the system shown in FIG. 1.

FIG. 2 is a schematic diagram illustrating the digital sample value with a period corresponding to 32.4 MHz output from A/D converter 16. Envelope line H of sample values ... $x(-4), x(-3), \ldots x(3), x(4)$ ... corresponds to the sample value analog signal before the A/D conversion. Every other sample value, that is, the sample values with a period corresponding to 16.2 MHz, ... $x(-4), x(2), x(0), x(2), x(4)$ ... are sample values corresponding to the analog sample values (original sample values) of the sample value analog signal. The sample values adjacent to these resample values, ... $x(-3), x(-1), \ldots x(1), x(3), \ldots$ are not needed for regeneration as the intrinsic MUSE signal. However, they are used for noise reduction in this embodiment.

Figure 3:
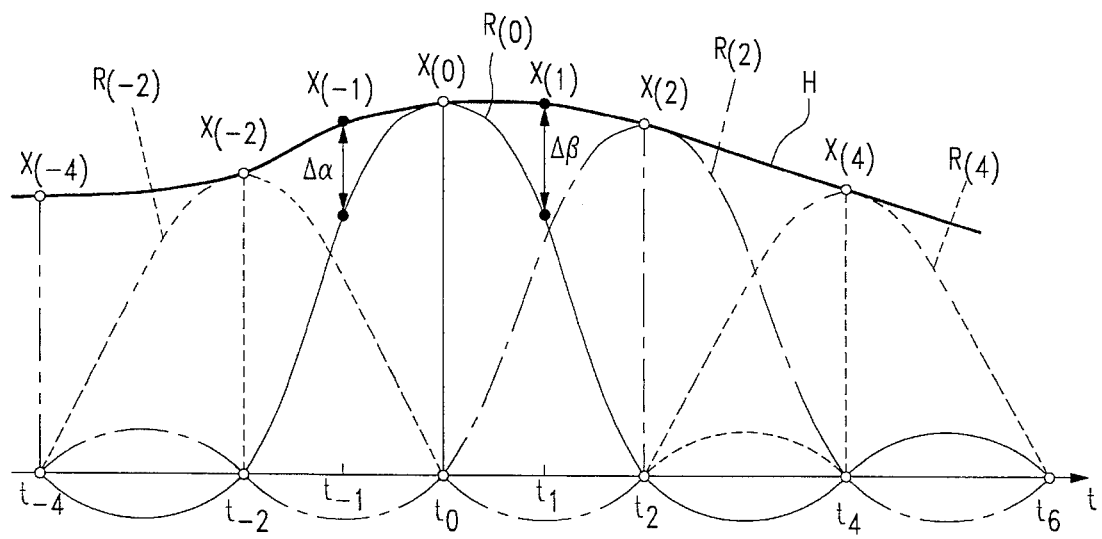
FIG. 3 is a waveform diagram illustrating impulse response waveforms corresponding to the series of resample values waveform equalized by means of the waveform equalizer of the system shown in FIG. 1.

As shown in FIG. 1, the digital sample value output from A/D converter 16 is input to waveform equalizer 18. In the MUSE format, the sampling condition is determined to ensure that there is no interference among the resample values and that it becomes the impulse response of the 10% cosine roll-off characteristics having symmetry with respect to 8.1 MHz. As shown in FIG. 3, on the time axis, each of the impulse response waveforms ... $R(-4), R(-2), R(0), R(2), R(4), \ldots$ corresponding to a series of resample values $\ldots x(-4), x(-2), x(0), x(2), x(4), \ldots$ should be a waveform which crosses null at the other resample point. Waveform equalizer 18 performs waveform equalizing processing on resample values $x(-4), x(0), x(2), x(4) \ldots$ to meet this resampling condition.

As shown in FIG. 1, the sample values ... $x(-4), x(-3), \ldots x(3), x(4), \ldots$ with a period corresponding to 32.4 MHz output from waveform equalizer 18 are input to noise reducing unit 20. At noise reducing unit 20, the following noise reducing method is performed based on these sample values ... $x(-4), x(-3), \ldots x(3), x(4), \ldots$.

Figure 4:
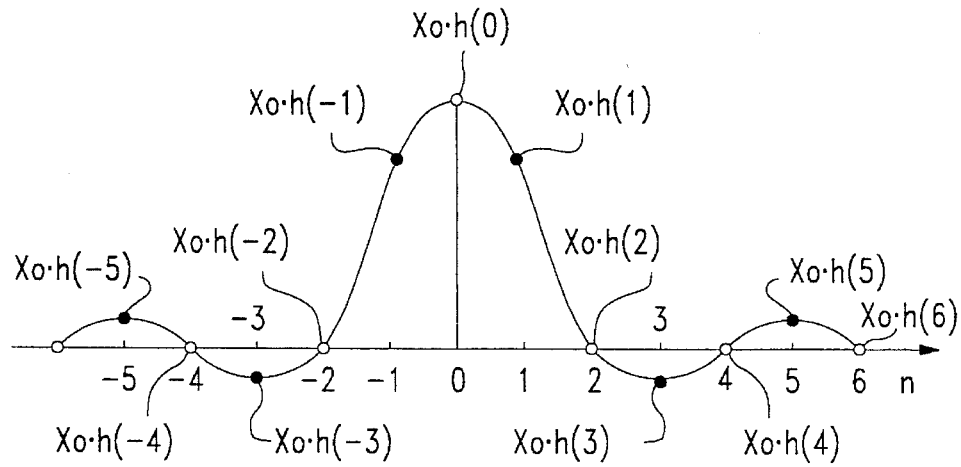
FIG. 4 is a diagram of the impulse response waveform corresponding to the resample values processed by waveform equalization in the MUSE format represented as the correlation function.

FIG. 4 shows the impulse response waveform corresponding to one of the various resample values (such as $x(0)$) processed for waveform equalizing using the MUSE format.

In this impulse response waveform, the values at the various points with period corresponding to 32.4 MHz are given as the correlation value x(0)·h(n), that is, the product of peak value x(0) and coefficient h(n) given by the following formula:

$$h(n)=4\omega \times [1/\{-1(\omega T/5\pi)\}] \times \{\sin(\omega nT)/\omega nT\} \times \{\cos(\omega nT)/10\} \quad (5)$$

where, $$\omega = 2\times\pi\times 8.1\times 10^6, T = 1/(32.4\times 10^6) \quad$$

and n is an integer.

In FIG. 3, consider resample value x(0). Sample values x(−1) and x(1) before and after it are values derived by adding the prescribed correlation value sums Δβ and Δβ̄, respectively, of the other resample values ... x(−4), x(−2), x(2), x(4) ... at sample point (t−1, t1) to the correlation values x(0)·h(−1) and x(0)·h(1) of sample value x(0) at sample point (t−1, t1). That is, the following formulas are established:

$$X(-1)=x(0)\cdot h(-1)+\Delta\alpha \quad (6)$$

$$X(-1)=x(0)\cdot h(-1)+\Delta\beta \quad (7)$$

At sample point t−1, as the correlation values of resample values x(−4), x(−2), x(2), x(4) are x(−4)·h(3), x(−2)·h(1), x(2)·h(3), and x(4)·h(5), respectively, Δα can be represented by the following formula:

$$\Delta\alpha=(k=1\sim Q)\Sigma x(2k)\times h(-2k-1)+(k=-Q\sim-1)\Sigma x(2k)\times h(-2k-1) \quad (8)$$

Also, at sample point t1, as the correlation values of resample values x(−4), x(−2), x(2), x(4) are x(−4)·h(5), x(−2)·h(3), x(2)·h(−1), and x(4)·h(−3), respectively, Δβ can be represented by the following formula:

$$\Delta\beta=(k=1\sim Q)\Sigma x(2k)\times h(-2k+1)+(k=-Q\sim-1)\Sigma x(2k)\times h(-2k+1) \quad (9)$$

In formulas (8) and (9), Q is an integer corresponding to the number of the other resample values which can be taken as having a significant correlation value at sample point (t−1, t1). This integer corresponds to the number of filter taps in noise reducing unit 20.

Formulas (6) and (7) can be rearranged as follows:

$$x(0)\cdot h(-1)=x(-1)-\Delta\alpha \quad (10)$$

$$x(0)\cdot h(1)=x(1)-\Delta\beta \quad (11)$$

From formulas (10) and (11), the following fact can be observed. That is, values (x(−1)−Δα) and (x(1)−Δβ) derived by subtracting from sample values x(−1) and x(1) before and after each resample value x(0), the correlation value sums Δα and Δβ of the other resample values at these sample points (t−1, t1), are values corresponding to the correlation values x(0)·h(−1) and x(0)·h(1) of resample value x(0) at sample point (t−1, t1). Consequently, value P defined by the following formula derived by adding these calculated values (x(−1)−Δα) and (x(1)−Δβ) to resample value x(0) is the correlation value having a prescribed ratio (amplification rate) with respect to resample value x(0).

$$P=x(0)+\{x(-1)-\Delta\alpha\}+\{x(1)-\Delta\beta\} \quad (12)$$

Formula (12) can be rearranged to the following:

$$P=\{x(0)+x(-1)+x(1)\}-(\alpha\Delta+\Delta\beta) \quad (13)$$

In above formulas (12) and (13), x(0), x(−1), x(1) are the sample values derived from waveform equalizer 18. Δα and Δβ are values calculated from formulas (5), (8), and (9) based on the prescribed number of resample values ( ... x(−4), x(−2), x(2), x(4) ... ) around each resample value x(0).

In this embodiment, noise reducing unit 20 performs an operation according to formula (12) or formula (13). A constant value with respect to each resample value x(0) is taken for operation value P. That is, as h(−1)=0.63 and h(1)=0.63 according to formula (5), one has $$\{x(-1)-\Delta\alpha\}\approx 0.63\cdot x(0), \{x(1)-\Delta\beta\}\approx 0.63\cdot x(0)$$

from formulas (10) and (11). Consequently, the operation results of formula (12) or (13) are as follows:

$$P = x(0) - \{h(0) + h(-1) + h(1)\} \approx x(0)\{1 + 0.63 + 0.63\} \approx \quad (14)$$

$$2.26 \cdot x(0)$$

In this way, in the noise reducing circuit 14 of this embodiment, the various resample values x(2k) (where k represents an integer) input to noise reducing unit 20 are amplified by about 2.26 times and output. On the other hand, as there is no correlation between each resample value and the noise contained in the sample values, amplification rate GN of the noise corresponding to formula (12) may be represented approximately by the following formula:

$$Gn \approx (1^2 + 1^2 + 1^2)^{1/2} \approx (3.00)^{1/2} \approx 1.73 \quad (15)$$

That is, the noise contained in the various resample values x(2k) (where k represents an integer) from waveform equalizer 18 is amplified by a factor of about 1.73 in noise reducing unit 20. Consequently, from formulas (14) and (15), for the output of noise reducing unit 20, the S/N ratio is increased by about 2.3 dB. S/N≈2.26/1.73

$$\approx 1,305 \quad (16)$$
$$\approx 2, 3dB$$

As explained, in this embodiment, for the various sample values processed for waveform equalizing, the correlation value of the impulse response waveforms corresponding to the resample values can be derived from the sample values around the resample value and the other resample values, and the resample value and the correlation value are added according to formula (12). In this way, the intrinsic value of the resample value is amplified with an amplification rate higher than that for the noise, that is, the S/N ratio is increased. That is, the noise reducing method in which a series of sample values in the vicinity of each resample value are used to increase the S/N ratio for each resample value is different from the conventional method in which the correlation among the various frames is exploited. Consequently, no trailing phenomenon takes place even for the edge of the moving image portion, and the same noise reduction as that for the static picture can be realized.

As shown in FIG. 1, only resample values ... x(−4), x(−2), x(0), x(2), x(4) ... at 16.2 MHz corresponding to the original sample values are input as a digital MUSE signal from noise reducing circuit 14 to decoding processing unit 22. At decoding processing unit 22, the audio signal and the control signal are isolated from the video signal. For the video signal, inter-frame interpolation, inter-field interpolation, or other interpolation processing is performed, and color signal processing is also performed, so that RGB signals are obtained from the output terminal.

Figure 5:
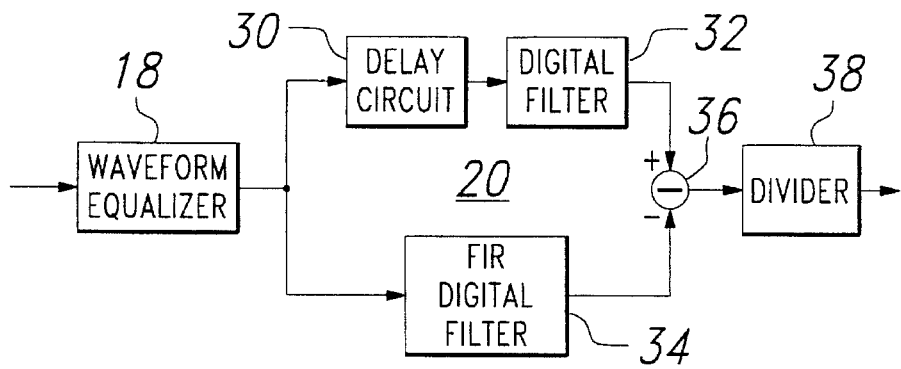
FIG. 5 is a block diagram illustrating a specific configuration of the noise reducing unit of the system shown in FIG. 1.

FIGS. 5–8 illustrate an example of a specific configuration of the noise reducing unit 20. As shown in FIG. 5, noise reducing unit 20 comprises 63-tap delay circuit 30, 3-tap digital filter 32, 64-tap delay FIR digital filter, subtractor 36, and divider 38. The sample values . . . x(−4), x(−3), . . . x(3), x(4) . . . with a period corresponding to 32.4 MHz and output from waveform equalizer 18 are input to delay register 30 and FIR register 34 in noise reducing unit 20.

Figure 6:
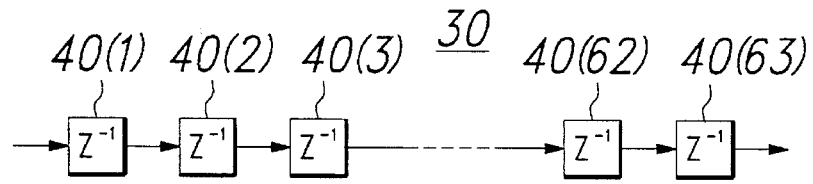
FIG. 6 is a block diagram illustrating a specific configuration of the delay circuit in the noise reducing unit shown in FIG. 5.

As shown in FIG. 6, delay circuit 30 comprises 63 delay registers 40(1)–40(63) connected in series, and delaying for 63 taps the input sample values . . . x(−4), x(−3), . . . x(3), x(4) . . . for output.

Figure 7:
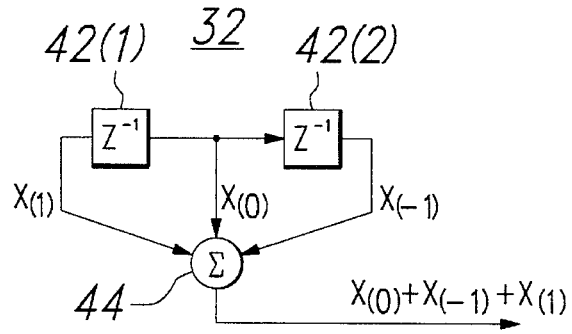
FIG. 7 is a block diagram illustrating a specific configuration of the digital filter in the noise reducing unit shown in FIG. 5.

As shown in FIG. 7, digital filter 32 comprises two delay registers 42(1) and 42(2), which are connected in series. The three taps in these delay registers 42(1) and 42(2) are connected to the input terminals of adder 44. From the output terminal of this digital filter 32, in a period corresponding to 16.2 MHz, the value {x(−1)+x(0)+x(1)} with sample values x(−1) and x(1) before and after each resample value x(2k), such as x(0), is obtained. This output {x(−1)+x(0)+x(1)} corresponds to the first term on the right-hand side of formula (13). As there is one tap in digital filter 32, this 1-tap delay and the 63-tap delay of delay circuit 30 are merged to form a 64-tap delay, which is in synchronization with the output of the 64-tap FIR digital filter 34.

Figure 8:
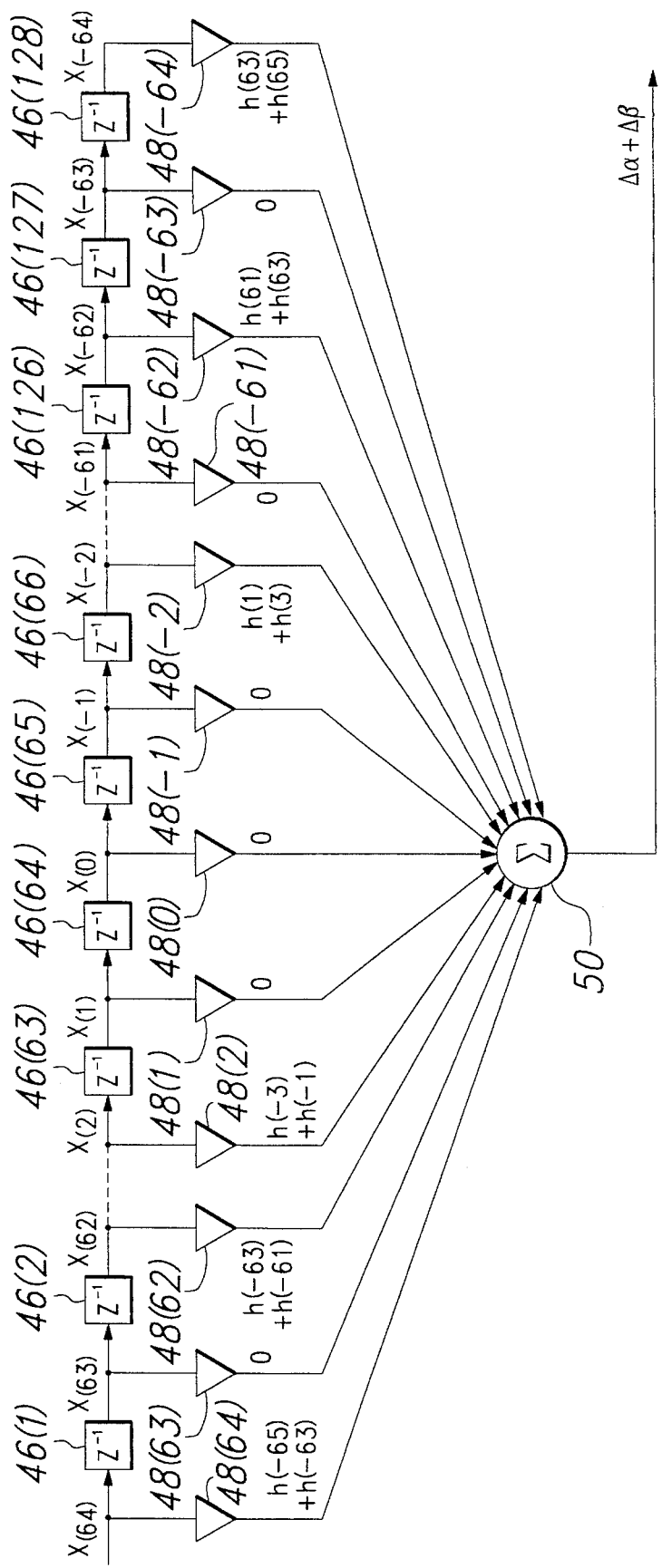
FIG. 8 is a block diagram illustrating a specific configuration of the FIR digital filter in the noise reducing unit shown in FIG. 5.

In FIG. 8, 64-tap FIR digital filter 34 has 128 delay registers 46(1)–64(128) connected in series. In these delay registers 46(1)–48(128), the 129 taps are connected to the input terminals of adder 50 via coefficient multipliers 48(64), 48(63), . . . 48(1), 48(0), 48(−1), . . . 48(−63), 48(−64), respectively. In these 129 coefficient multipliers 48(n) (with −64≦n≦64), the following multiplication coefficients EH(n) are defined.

$$EH(n) = 0:n = -1, 0, 1 \quad (17)$$
$$EH(n) = h(-2k + 1) + h(-2k - 1)$$
$$:n = 2k(-32 \leq k \leq -1, 1 \leq k \leq 32)$$
$$EH(n) = 0:n = 2k + 1(-32 \leq k \leq -1, 1 \leq k \leq 31)$$

The second term (Δα+Δβ) on the right-hand side of formula (13) can be represented as follows by means of formulas (8) and (9).

$$\Delta\alpha+\Delta\beta=(k=1-Q)\Sigma x(2k)\{h(-2k-1)+ h(-2k+1)\}+(k=-Q-1)\Sigma x(2k)\{h(-2k-1)+ h(-2k+1)\} \quad (18)$$

In this digital filter 34, the value of Q in formula (18) is 32, and the first term on the right-hand side of formula (18), x(2k) {h(−2k−1)+h(−2k+1)}, is obtained at a period corresponding to 16.2 MHz at the output terminals of the left half coefficient multipliers 48(2k) (1≦k≦32) while the second term on the right-hand side of formula (18), x(2k) {h(−2k−1)+h(−2k+1)}, is obtained at a period corresponding to 16.2 MHz at the output terminals of the right half coefficient multipliers 48(2k) (−32≦k≦1). Consequently, at the output terminal of adder 50, the operation value of (Δα+Δβ) of the right-hand side of formula (18) is obtained at a period corresponding to 16.2 MHz.

As shown in FIG. 5, at a period corresponding to 16.2 MHz, one input terminal of subtractor 36 receives output {x(−1)+x(0)+x(1)} of digital filter 32, while the other input terminal receives the output (Δα+Δβ) of digital filter 34. From the former {x(−1)+x(0)+x(−1)}, the latter (Δα+Δβ) is subtracted. This subtraction corresponds to the operation for the right-hand side of formula (12), and an output corresponding to operation value P of formula (12) is obtained at the output terminal of subtractor 36. As shown in formula (13), the output of subtractor 36 has a value about 2.26 times the resample values x(2k) obtained at the output terminal of waveform equalizer 18. On the other hand, in the noise reducing circuit shown in FIGS. 5–8, as the noise has no correlation, the amplification rate BN can be calculated as follows:

$$BN = \quad (19)$$
$$\{(n = -64 \sim 64)\Sigma|EH(n)|^2 = (k = -1 \sim 1)\Sigma|FH(n)|^2\}^{1/2} \approx$$
$$(3.00)^{1/2} \approx 1.73$$

where, FH(n) represents the multiplication coefficients of the taps in digital filter 32. They are unified in the case shown in FIG. 7.

The value of formula (19) is almost equal to the value of formula (15). Consequently, in noise reducing unit 18 shown in FIGS. 5–8 the S/N ratio is increased by about 2.3 dB as follows:

$$S/N \approx 2.26/1.73 \quad (20)$$
$$\approx 1.305$$
$$\approx 2.3\text{dB}$$

In FIG. 5, divider 38 divides the output of subtractor 36 by division coefficient {h(0)+h(−1)+h(1)} (=2.26). In this way, resample value x(2k) equal to the digital value before input to noise reducing unit 20 can be obtained at the output terminal of divider 38.

Figure 9:
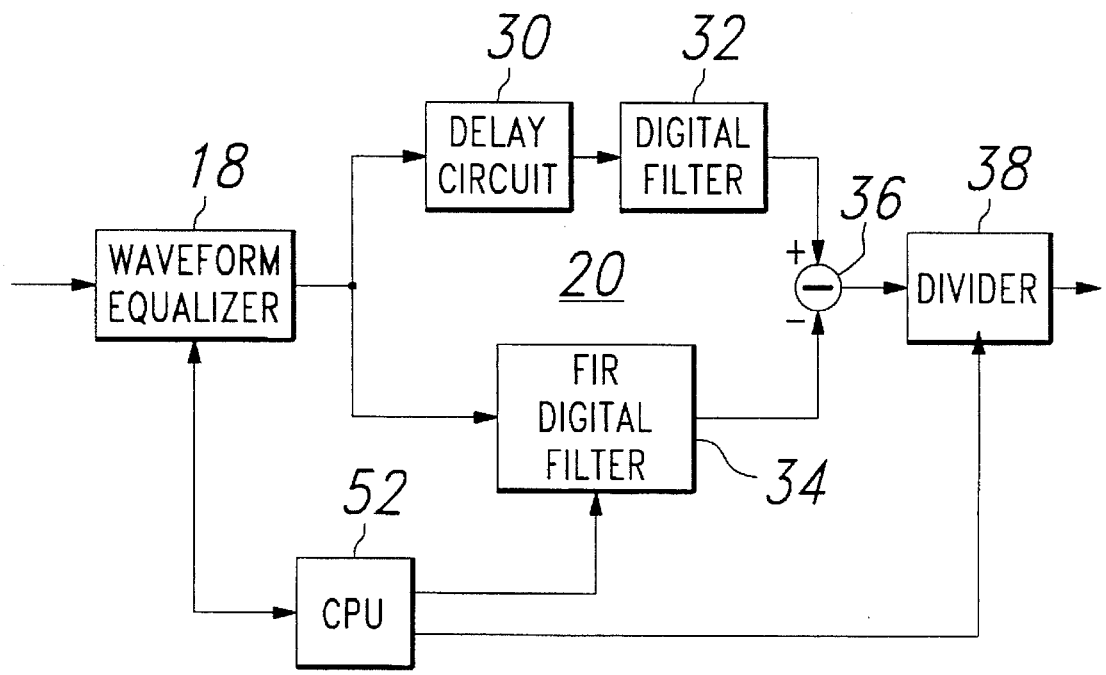
FIG. 9 is a block diagram illustrating a modified configuration of the noise reducing unit shown in FIG. 5.

FIG. 9 shows a modified example of the circuit configuration of FIG. 5. CPU 52 performs training for determining the filter coefficient of waveform equalizer 18, and records the impulse response wave form after the end of the wave form equalizing operation. When the impulse response waveform is not the ideal waveform as shown in FIG. 3, the correlation function of formula (5) is deformed to function h'(n) corresponding to the non ideal impulse response function as shown in FIG. 3. In FIR digital filter 34, the multiplication coefficients set for coefficient multipliers 48(n) (where −64≦n≦64) are corrected as follows:

$$EH'(n) = 0:n = -1, 0, 1 \quad (21)$$
$$EH'(n) = h'(-2k + 1) + h'(-2k - 1)$$
$$:n = 2k(-32 \leq k \leq -1, 1 \leq k \leq 31)$$
$$EH'(n) = 0:n = 2k + 1(-32 \leq k \leq -1, 1 \leq k \leq 31)$$

In addition, CPU 52 amends the division coefficients of subtractor 36 to {h(0)+h'(−1)+h'(1)}.

Figure 10:
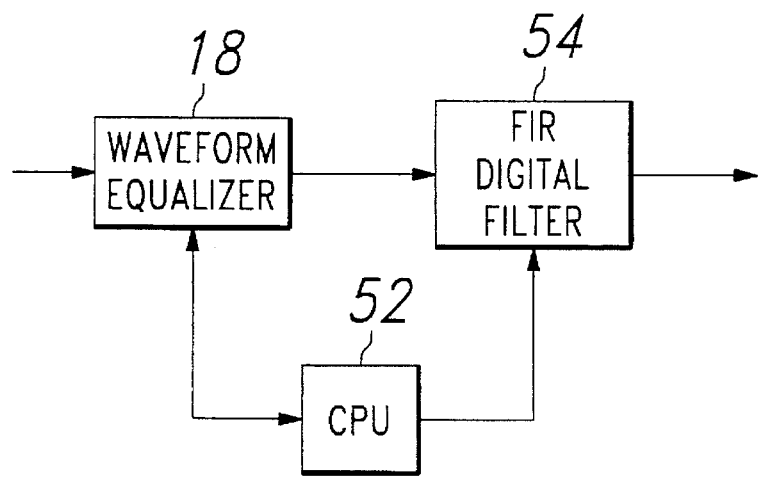
FIG. 10 is a block diagram illustrating another modified configuration of the noise reducing unit shown in FIG. 5.
Figure 11:
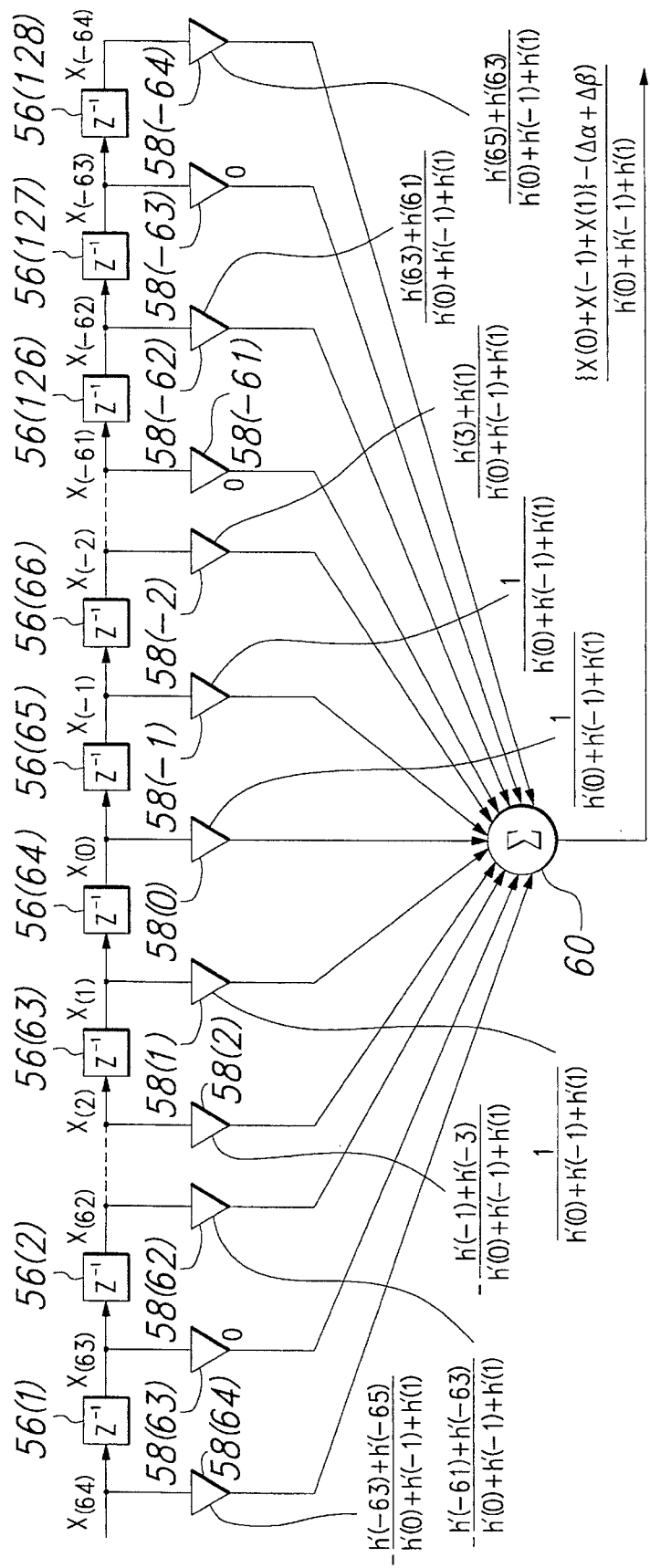
FIG. 11 is a block diagram illustrating a specific configuration of the FIR digital filter that forms the noise reducing unit shown in FIG. 10.

FIG. 10 shows the configuration of noise reducing circuit 20 made of one FIR digital filter 54. As shown in FIG. 11, FIR digital filter 54 has 128 delay registers 56(1)–54(128) connected in series. In these delay registers 56(1)–56(128), the 129 taps are connected to the input terminals of adder 60 via coefficient multipliers 58(64), 58(63), . . . 58(1), 58(0), 58(−1), . . . 58(−63), 58(−64), respectively. In these 129 coefficient multipliers 58(n) (with −64≦n≦64), the following multiplication coefficients LH'(n) are defined.

$$LH'(n) = 1/\{h(0) + h'(-1) + h'(1)\}:n = -1, 0, 1 \quad (22)$$
$$LH'(n) = -\{h'(-2k + 1) +$$
$$h'(-2k - 1)\}/\{h(0) + h'(-1) +$$
$$h'(1)\}:n = 2k(-32 \leq k \leq -1, 1 \leq k \leq 32)$$
$$LH'(n) = 0:n = 2k + 1(-32 \leq k \leq -1, 1 \leq k \leq 31)$$

For multiplication coefficients LH'(n) defined in formula (22), {h(0)+h'(−1)+h'(1)} in the denominator corresponds to the division coefficient of the divider 38. In the multiplication coefficients LH'(1), LH'(0), LH'(−1) corresponding to coefficient multipliers 58(1), 58(0), 58(−1), the value 1 of the numerator corresponds to the filter coefficient of the 3-tap digital filter 32. The value of numerator of {h'(−2k+1)+h'(−2k−1)} in the multiplication coefficients LH'(64) . . . LH'(2), LH'(−2) . . . LH(−64) corresponding to the residual coefficient multipliers 58(64) . . . 58(2), 58(−2) . . . 58(−64) corresponds to the filter coefficient of FIR digital filter 34 in FIG. 9. In addition, the symbol (−) attached to {h'(−2k+1)+ h(−2k−1)} corresponds to the subtraction operation in the subtractor 36.

In FIG. 12, waveform equalizer 18 in FIG. 10 and noise reducing circuit 20 [54] are combined as 64-tap FIR digital filter 62. FIG. 13 is a diagram illustrating the processing procedure of CPU 52 for determining the filter coefficients MH(n) of the FIR digital filter 62. First of all, with the FIR digital filter 62 used as a waveform equalizer, training is performed for waveform equalization [64]. It is possible to use the VIT pulses overlapped on the vertical backsweep period of the MUSE signal as the training signal. By means of the training, coefficients MH'(n) related to waveform equalizing are set at the various coefficient multipliers in digital filter 62 [66]. Then, coefficients MH'(n) related to the waveform equalizing are overlapped with the coefficients related to the noise reducing processing of noise reducing unit 20, such as coefficients LH'(n) in FIR digital filter 54 shown in FIG. 9. Coefficients MH'(n) obtained as a result of the overlapping are set in the various coefficient multipliers in FIR digital filter 70.

An explanation has been provided with reference to several preferable examples. However, this invention is not limited to the described embodiments. Various modifications and changes can be made within the scope of the invention as long as the technical points of the invention are observed. For example, the number of taps of the digital filter can be set at will, and it is possible to form the noise reducing unit and the waveform equalizer using an IIR digital filter instead of an FIR digital filter.

In a described embodiment, for each resample value, such as x(0), resample value x(0) is added to the correlation values around x(0), x(0)·h(−1) or {x(−1)−Δα} and x(0)·h(1) or {x(1)−Δβ} (formula (12)). As one correlation value, such as x(0)·h(−1) alone, is added to resample value x(0), noise reduction can be realized according to this invention.

In the latter embodiment, the waveform equalizer for the MUSE format high-vision receiver is shared with the noise reducing operation. Consequently, the noise reducing circuit of this invention can be realized with a small scale and at a low cost. In addition to the MUSE format high-vision receiver, the noise reducing circuit of this invention can also be used in any other receiving unit of a communication system for sample value analog signal transmission. Consequently, the transmission rate and the sampling frequency are not limited to the values in the described embodiment (16.2 MHz, 32.4 MHz).

As explained previously, in the noise reducing circuit of this invention, for each of the resample values processed by waveform equalizing processing, the correlation value in the impulse response waveform corresponding to the resample values is derived from the sample values around the resample value and other resample values, and the sum of the resample values and their correlation values is calculated. In this way, the S/N ratio of the resample values can be increased by using the series of sample values around each resample value. Consequently, effective noise reduction is performed for both the static picture and for eliminating the trailing phenomenon at the edge of the moving image portion.

I claim:

1. A noise-reducing circuit for an input sample value analog signal, comprising:

an A/D converter for sampling the sample value analog signal at a frequency at least twice its transmission rate to produce a stream of first resample values;

a waveform equalizing circuit responsive to the A/D converter for waveform-equalizing the first resample values into a stream of second resample values; and a S/N enhancing circuit, responsive to the second resample values from the waveform equalizing circuit, for deriving a corresponding correlation value for each second resample value from the stream of second resample values and adding the corresponding correlation value to the second resample value to produce a third resample value.

2. The noise-reducing circuit of claim 1 wherein the first resample values are waveform-equalized by the waveform equalizing circuit according to a prescribed MUSE condition.

3. The noise-reducing circuit of claim 1 wherein the S/N enhancing circuit derives the corresponding correlation value for each second resample value from impulse response waveforms corresponding to the stream of second resample values.

4. The noise-reducing circuit of claim 2 wherein the S/N enhancing circuit derives the corresponding correlation value for each second resample value from impulse response waveforms corresponding to the stream of second resample values.

5. A method of noise-reducing a sample value analog signal, comprising the steps of:

A/D sampling the sample value analog signal at a frequency at least twice its transmission rate to produce a stream of first resample values;

waveform-equalizing the first resample values into a stream of second resample values;

deriving a corresponding correlation value for each second resample value from the stream of second resample values; and adding the corresponding correlation value to the second resample value to produce a third resample value.

6. The method of claim 5 wherein the first resample values are waveform-equalized according to a prescribed MUSE condition.

7. The method of claim 5 wherein the corresponding correlation value for each second resample value is derived from impulse response waveforms corresponding to the stream of second resample values.

8. The method of claim 6 wherein the corresponding correlation value for each second resample value is derived from impulse response waveforms corresponding to the stream of second resample values.

* * * * *